(12) United States Patent
Hosaka

(10) Patent No.: US 10,743,409 B1
(45) Date of Patent: Aug. 11, 2020

(54) WIRING STRUCTURE AND ELECTRONIC DEVICE

(71) Applicant: InnoLux Corporation, Miao-Li County (TW)

(72) Inventor: Shuhei Hosaka, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/450,988

(22) Filed: Jun. 24, 2019

(51) Int. Cl.
| | |
|---|---|
| *H05K 1/02* | (2006.01) |
| *H05K 1/14* | (2006.01) |
| *H01L 23/00* | (2006.01) |
| *H01L 23/495* | (2006.01) |
| *H01L 23/498* | (2006.01) |
| *H01L 27/32* | (2006.01) |
| *H01L 27/12* | (2006.01) |

(52) U.S. Cl.
CPC .......... *H05K 1/0296* (2013.01); *H01L 27/124* (2013.01); *H05K 2201/09227* (2013.01); *H05K 2201/09245* (2013.01); *H05K 2201/09681* (2013.01)

(58) Field of Classification Search
CPC . H05K 1/02; H05K 1/14; H01L 23/00; H01L 23/495; H01L 23/498; H01L 27/32
USPC ............................................ 174/261; 257/88
See application file for complete search history.

(56) References Cited

U.S. PATENT DOCUMENTS

| | | | |
|---|---|---|---|
| 10,348,365 B2* | 7/2019 | Kuroda | ................ H05K 1/0239 |
| 2011/0075089 A1 | 3/2011 | Jheng | |
| 2015/0194626 A1* | 7/2015 | Iijima | ................ H01L 51/5246 257/88 |
| 2016/0218053 A1* | 7/2016 | Cho | .................... G02F 1/13452 |
| 2017/0372992 A1* | 12/2017 | Chung | ............. H01L 23/49827 |
| 2018/0059449 A1* | 3/2018 | Kim | ..................... G02F 1/1309 |

FOREIGN PATENT DOCUMENTS

| | | |
|---|---|---|
| CN | 102243383 | 11/2011 |

* cited by examiner

*Primary Examiner* — Xiaoliang Chen
(74) *Attorney, Agent, or Firm* — Winston Hsu

(57) ABSTRACT

The present disclosure includes an electronic device including a wiring structure, the wiring structure includes a first wiring pattern including a plurality of first input wires and a plurality of first output wires, a second wiring pattern including a plurality of second bridge wires, one second bridge wiring crosses at least one of the plurality of first input wires or at least one of the plurality of first output wires, and a first insulating layer disposed between the first wiring pattern and the second wiring pattern, the plurality of first input wires are electrically connected to the first output wires through the second bridge wires.

18 Claims, 8 Drawing Sheets

WIRING STRUCTURE AND ELECTRONIC DEVICE

BACKGROUND OF THE DISCLOSURE

1. Field of the Disclosure

The present disclosure relates to a wiring structure, and more particularly to an electronic device including the wiring structure.

2. Description of the Prior Art

Most of electronic device comprises a functional area with a plurality of functional units (e.g., displaying units, touching units, sensing unit, transmitting units, or receiving unit), a peripheral circuit area comprises a plurality of wires connected to the functional units respectively, and a chip IC connected drives the functional units through the wires. For narrow boarder purpose, the ratio of the functional area is getting higher and thus to compress the ratio of the peripheral circuit area. As resolution, quality, power increasing, number of wires or size of wires must increase to satisfy electrical requirement. New wiring structure must be developed for arranging more wires into a compact space.

SUMMARY OF THE DISCLOSURE

The present disclosure includes an electronic device including a wiring structure, the wiring structure includes a first wiring pattern comprising a plurality of first input wires extending along a first direction and a plurality of first output wires extending along the first direction, a second wiring pattern comprising a plurality of second bridge wires extending along a second direction different from the first direction, one of the plurality of second bridge wiring crosses at least one of the plurality of first input wires or at least one of plurality of first output wires, and a first insulating layer disposed between the first wiring pattern and the second wiring pattern, wherein the plurality of first input wires are electrically connected to the first output wires through the second bridge wires.

The present disclosure provides a wiring structure of an electronic device, the wiring structure can be formed by two different wiring patterns, and the two different wiring patterns can be electrically connected to each other through a plurality of contact structures. The two wiring patterns are overlapped with each other and to form the wiring structure with a mesh pattern region. The wiring structure with a mesh pattern region has some advantages, such as having a compact area or narrower width, thereby increasing the overall device density, or having a narrow boarder area.

These and other objectives of the present disclosure will no doubt become obvious to those of ordinary skill in the art after reading the following detailed description of the embodiment that is illustrated in the various figures and drawings.

DETAILED DESCRIPTION

Figure 1:
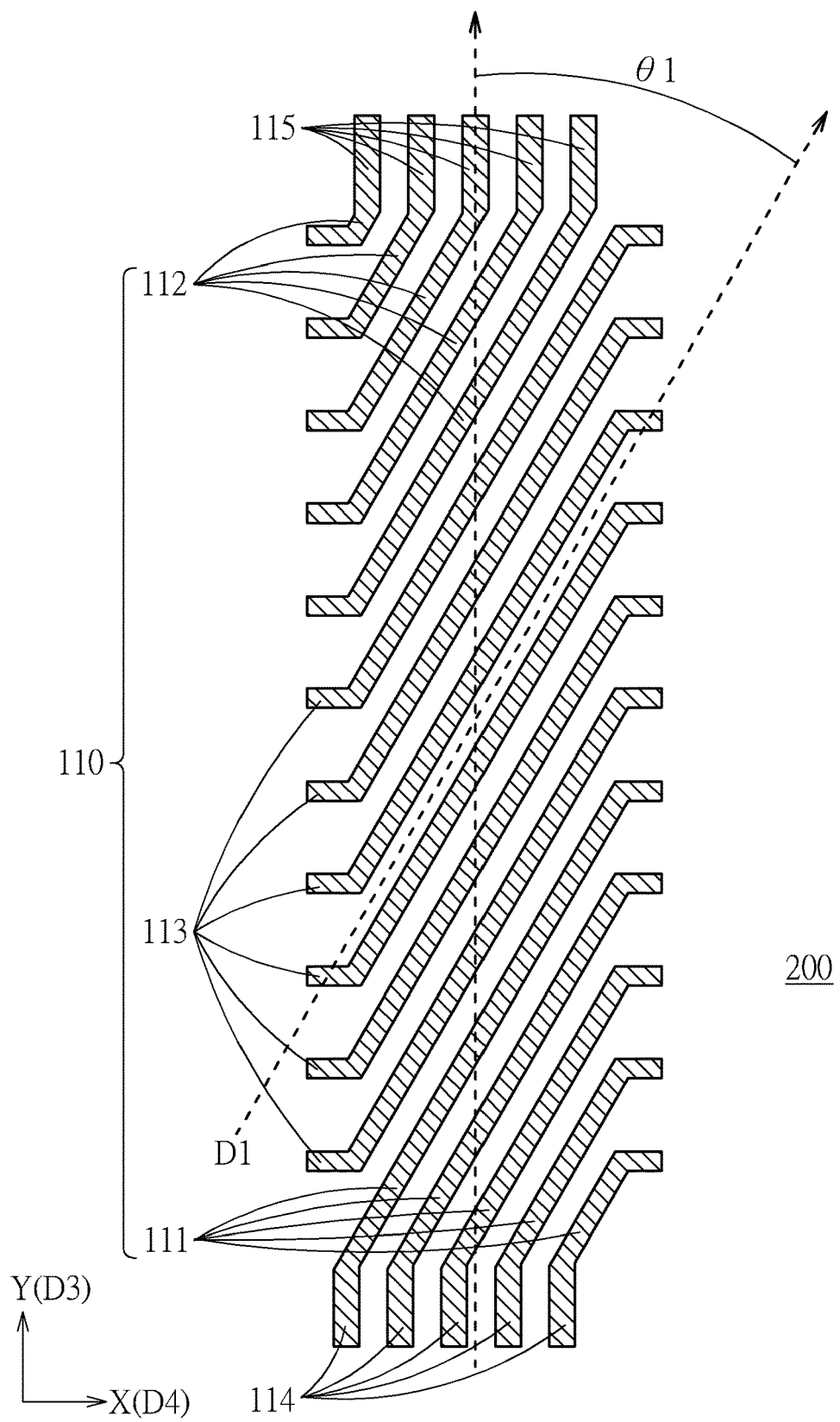
FIG. 1 is a schematic diagram showing a top view of a first wiring pattern according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device (i.e. a display device in this disclosure), and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them.

It will be understood that when an element or layer is referred to as being "connected to" another element or layer, it can be directly connected to the other element or layer, or intervening elements or layers may be presented. In contrast, when an element is referred to as being "directly connected to" another element or layer, there are no intervening elements or layers presented. In addition, when the component is referred to "be coupled to/with another component (or the variant thereof)", it may be directly connected to another component, or may be indirectly connected (such as electrically connected) to another component through other component or components.

It will be understood that when "a portion of a structure" is between another two components, this structure can be totally between or partially between these components.

The terms "about", "substantially", "equal", or "same" generally mean within 20% of a given value or range, or mean within 10%, 5%, 3%, 2%, 1%, or 0.5% of a given value or range.

In addition, the phrase "in a range from a first value to a second value" indicates the range includes the first value, the second value, and other values in between.

One wire "cross" another wire generally means two individual wires have overlap region in a top view (plane view). The two wires may be in different layers and electrically isolated to each other. One group of wires "interlace with" another group of wires generally means two individual groups of wires are arranged alternately into a stagger pattern.

Two wires "electrically independent" generally means that the two wires are electrically isolated in the beginning when there is no electrical connection (e.g., direct contact or contact to each other through via hole) therebetween, and they may be electrically connected while further electrical connection is established.

One direction is "inbetween" two the other directions generally mean an included angle (in counterclockwise direction) between the direction and a reference direction is between the other two included angles (in counterclockwise direction) between the other directions and the reference direction respectively.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Electronic device may be one of display device, antenna device, sensing device or splicing device, but not be limited thereto. Electronic device may be flexible or foldable devices. Electronic device may be liquid crystal display device, organic light emitting diode display device (OLED), inorganic light emitting diode display device (LED), minimeter-sized light emitting diode display device (mini-LED), micrometer-sized light emitting diode display device (micro-LED), quantum dot light emitting diode display device (QLED), but not be limited thereto. Antenna device may be liquid crystal antenna device, but not be limited thereto. Splicing device may be splicing display device or splicing antenna device, but not be limited thereto.

It should be noted that the technical features in different embodiments described in the following can be replaced, recombined, or mixed with one another to constitute another embodiment without departing from the spirit of the present disclosure.

Figure 2:
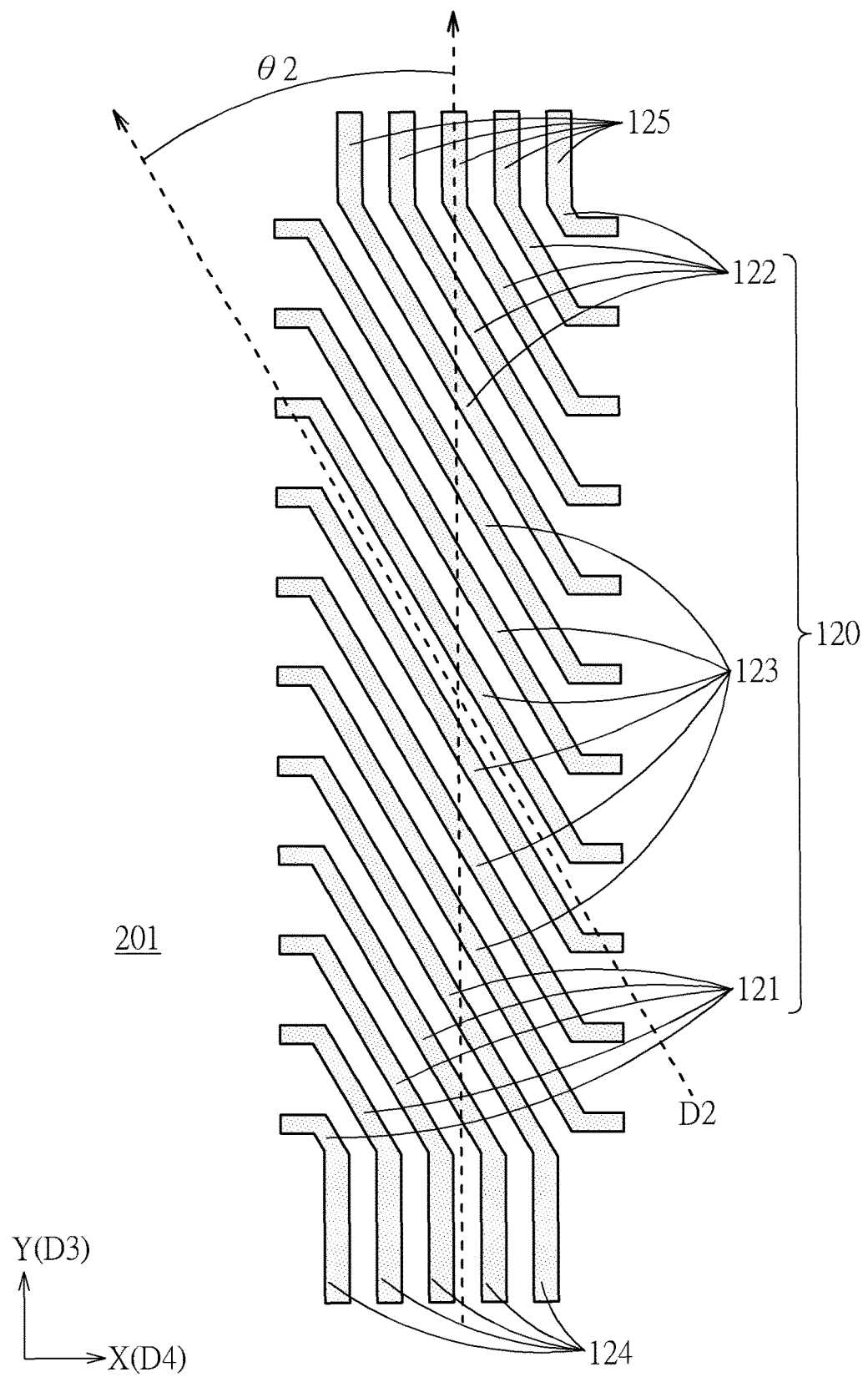
FIG. 2 is a schematic diagram showing a top view of a second wiring pattern according to a first embodiment of the present disclosure.
Figure 3:
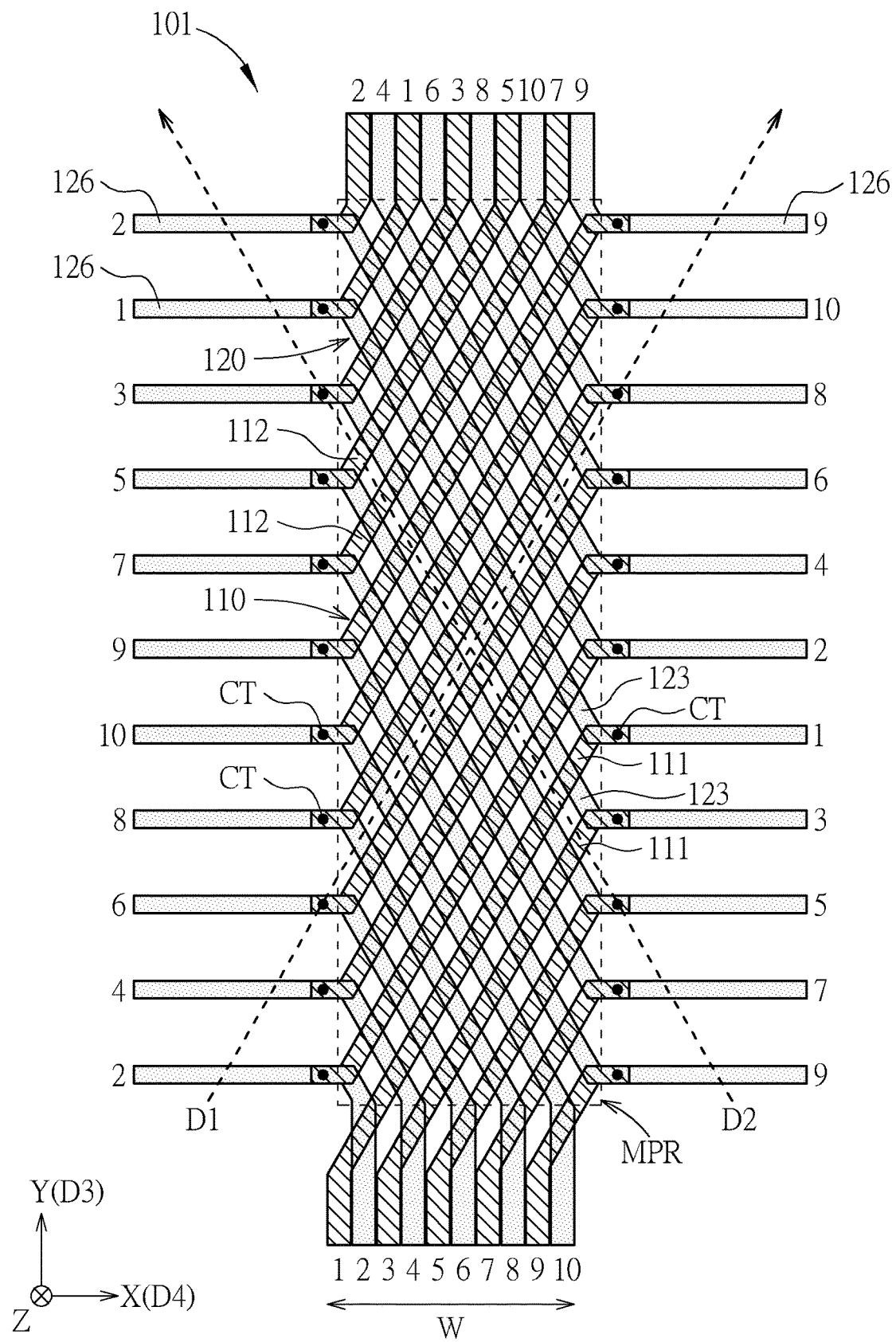
FIG. 3 is a schematic diagram showing a top view of a wiring structure comprising the first wiring pattern, the second wiring pattern and a plurality of second intermediate wirings according to a first embodiment of the present disclosure.

Referring to FIG. 1 to FIG. 3, FIG. 1 is a schematic diagram showing a top view of a first wiring pattern according to a first embodiment of the present disclosure, FIG. 2 is a schematic diagram showing a top view of a second wiring pattern according to a first embodiment of the present disclosure, and FIG. 3 is a schematic diagram showing a top view of a wiring structure of an electronic device comprising the first wiring pattern, the second wiring pattern and a plurality of second intermediate wires according to a first embodiment of the present disclosure. The wiring structure may be located in a peripheral area of the electronic device, and the wiring structure is electrically connected to a plurality of function units of a functional area of the electronic device and driving IC. The functional units may be display units (e.g., display pixels, light emitting diode), sensing units (e.g., touch sensors, finger print sensors), or antenna units, but not limited thereto. The wiring structure still may be located in the functional area for driving functional units. As shown in FIG. 1, the present disclosure includes a wiring structure 101 in an electronic device, the wiring structure 101 may include at least two patterns: a first wiring pattern 110 (shown in FIG. 1) and a second wiring pattern 120 (shown in FIG. 2). In one embodiment of the present disclosure, the first wiring pattern 110 and the second wiring pattern 120 are in different layers and electrically independent to each other, and separated with an insulating layer. In one embodiment of the present disclosure, the second wiring pattern 120 is disposed above the first wiring pattern 110, in other words, when viewed in a top view, the second wiring pattern 120 partially overlaps the first wiring pattern 110. In another embodiment, the second wiring pattern 120 is under the first pattern 110. In one embodiment of the present disclosure, the first wiring pattern 110 and the second wiring pattern 120 are symmetrical along a vertical direction (such as the Y-axis shown in FIG. 1), but not limited thereto. In another embodiment, an included angle (acute angle) between the first wiring pattern 110 and the vertical direction is different from an include angle (acute angle) between the second wiring pattern 120 and the vertical direction, and the first wiring pattern 110 and the second wiring pattern 120 are asymmetrical.

In one embodiment of the present disclosure, the first wiring pattern 110 may at least comprise three parts: a plurality of first input wires 111, a plurality of first output wires 112 and a plurality of first bridge wires 113, wherein in some embodiments, each first input wires 111, each first output wires 112 and each first bridge wires 113 are arranged along a first direction D1 separately and electrically independent to each other. Besides, in the top view, the angle (acute angle) between the vertical direction (i.e. the Y-axis) and the first direction D1 (in clockwise direction) is defined as a first angle $\theta1$, wherein in the present disclosure, the first angle $\theta1$ is greater than 0 degree and smaller than 90 degrees.

In one embodiment of the present disclosure, the first input wires 111, the first output wires 112 and the first bridge wires 113 are separated from each other with interval therebetween. In other words, the plurality of the first input wires 111 do not contact to each other directly, the plurality of the first output wires 112 do not contact to each other directly, and the plurality of the first bridge wires 113 do not contact to each other directly. In addition, in one embodiment of the present disclosure, the number of the first input wires 111 can be same as the number of the first output wires 112. For example, in this embodiment, there are five first input wires 111 and five first output wires 112 shown in FIG. 1. However, the present disclosure is not limited thereto. In another embodiment, the number of first input wires 111 is different from the number of the first output wires 112. Besides, the first bridge wires 113 are disposed between the first input wires 111 and the first output wires 112. In other words, the first bridge wires 113 are located in an interval space between an area of first input wires 111 and an area of first output wires 112.

Besides, in one embodiment of the present disclosure, the first wiring pattern 110 further comprises a plurality of first input terminals 114 and a plurality of first output terminals 115. The first input terminals 114 and the first output terminals 115 are arranged along a third direction D3 (i.e. the Y-axis). In the embodiment, the third direction D3 (i.e. the Y-axis) is inbetween the first direction D1 and the second direction D2. In one embodiment, each first input terminal 114 may be electrically connected to one first input wire 111 respectively (the first input terminals 114 may electrically connect to driving IC through contact pads), and the number of the first input wires 111 can be same as the number of the first input terminals 114 (for example, there are five first input terminals 114 shown in FIG. 1). In another embodiment, the number of the first input wires 111 can be different from the number of the first input terminals 114. On the other hand, each first output terminal 115 may be electrically connected to one first output wire 112 respectively (the first output terminals 115 may electrically connect to functional units in the functional area of the electronic device), and the number of the first output wires 112 can be same as the number of the first output terminals 115 (for example, there are five first output terminals 115 shown in FIG. 1). In another embodiment, the number of the first output wires 112 can be different from the number of the first output terminals 115.

In one embodiment of the present disclosure, the first wiring pattern 110 can be formed on a substrate 200, the substrate 200 may be a rigid substrate or a flexible substrate, wherein the rigid substrate may be such as a glass substrate, a plastic substrate, a quartz substrate, a sapphire substrate or other suitable rigid substrate, and the flexible substrate may include polyimide (PI), polyethylene terephthalate (PET) and/or other suitable flexible material, but not limited thereto. And first wiring pattern 110 may include metal (Cu, Al, Mo, Ti, Ag, Au, etc.) and/or transparent conductive material, wherein the transparent conductive material can include indium tin oxide (ITO), indium zinc oxide (IZO)) and/or any other suitable conductive material, but not limited thereto.

Next, as shown in FIG. 2, a first insulating layer 201 is formed, to cover the substrate 200 and the first wiring pattern 110, and a second wiring pattern 120 is then formed on the first insulating layer 201. Therefore, the first insulating layer 201 is disposed between the first wiring pattern 110 and the second wiring pattern 120 for electrically isolated in the beginning. In order to simplify the illustration, only the second wiring pattern 120 is drawn in FIG. 2, and the first wiring pattern 110 is omitted from FIG. 2.

In one embodiment of the present disclosure, the material of the first insulating layer 201 may include silicon oxide, silicon nitride, silicon oxynitride, aluminum oxide and/or any other suitable insulating material, but not limited thereto. The second wiring pattern 120 may include metal (Cu, Al, Mo, Ti, Ag, Au, etc.) and/or transparent conductive material, wherein the transparent conductive material can include indium tin oxide (ITO), indium zinc oxide (IZO)) and/or any other suitable conductive material, but not limited thereto. The second wiring pattern 120 can be formed on the first insulating layer 201, wherein the second wiring pattern 120 partially overlaps the first wiring pattern 110 in the top view, and in one embodiment of the present disclosure, the first wiring pattern 110 and the second wiring pattern 120 are symmetrical along a vertical direction, but not limited thereto. In another embodiment, an included angle between the first wiring pattern 110 and the vertical direction is different from an include angle between the second wiring pattern 120 and the vertical direction, and the first wiring pattern 110 and the second wiring pattern 120 are asymmetrical.

More detail, in one embodiment of the present disclosure, the second wiring pattern 120 may at least comprise three parts: a plurality of second input wires 121, a plurality of second output wires 122 and a plurality of second bridge wires 123, wherein in some embodiments, each second input wires 121, each second output wires 122 and each second bridge wires 123 are arranged along a second direction D2, and the second direction D2 is different from the first direction D1 mentioned above. Besides, in the top view, the angle (acute angle) between the vertical direction (i.e. the Y-axis) and the second direction D2 (in counterclockwise direction) is defined as a second angle θ2, wherein in the present disclosure, the second angle θ2 is greater than 0 degree and smaller than 90 degrees. In some embodiment, the first angle θ1 can be same as the second angle θ2, but not limited thereto.

In one embodiment of the present disclosure, the second input wires 121, the second output wires 122 and the second bridge wires 123 are separated from each other with interval therebetween. In other words, the plurality of the second input wires 121 do not contact to each other directly, the plurality of the second output wires 122 do not contact to each other directly, and the plurality of the second bridge wires 123 do not contact to each other directly. In addition, in one embodiment of the present disclosure, the number of the second input wires 121 may be same as the number of the second output wires 122. For example, in this embodiment, there are five second input wires 121 and five second output wires 122 shown in FIG. 2. However, the present disclosure is not limited thereto. Besides, the second bridge wires 123 are disposed between the second input wires 121 and the second output wires 122.

Besides, in one embodiment of the present disclosure, the second wiring pattern 120 further comprises a plurality of second input terminals 124 and a plurality of second output terminals 125 arranged along a third direction D3 (i.e. the Y-axis). Each second input terminal 124 may be electrically connected to one second input wire 121 respectively (the second input wires 121 may electrically connect to driving IC through contact pads), and the number of the second input wires 121 can be same as the number of the second input terminals 124 (for example, there are five second input terminals 124 shown in FIG. 2). In another embodiment, the number of second input wires 121 is different from the number of the second input terminals 124. On the other hand, each second output terminal 125 may be electrically connected to one second output wire 122 respectively (for example, the second output terminal 125 may electrically connect to functional units in the functional area of the electronic device), and the number of the second output wires 122 can be same as the number of the second output terminals 125 (for example, there are five second output terminals 125 shown in FIG. 2). In another embodiment, the number of the second output wires 122 can be different from the number of the second output terminals 125.

Next, referring to FIG. 3, the second wiring pattern 120 shown in FIG. 2 overlaps the first wiring pattern 110 shown in FIG. 1 in the top view. In other words, FIG. 3 is obtained by overlapping first wiring pattern 110 shown in FIG. 1 and the second wiring pattern 120 shown in FIG. 2. In order to simplify the illustration, the labels of some components are not shown in FIG. 3 (for example, the first input wires 111, the first output wires 112, the first bridge wires 113, the second input wires 121, the second output wires 122 or the second bridge wires 123 may be omitted in FIG. 3), but since the positions of these components are clearly indicated in FIGS. 1-2, the positions of these components in FIG. 3 can be known by comparing the components' positions in FIGS. 1-2.

As shown in FIG. 3, the wiring structure 101 of the present disclosure at least comprises the first wiring pattern 110 and the second wiring pattern 120. Since the first wiring pattern 110 is arranged along the first direction D1, and the second wiring pattern 120 is arranged along the second direction D2, after the first wiring pattern 110 and the second wiring pattern 120 are partially overlapped with each other, the plurality of first bridge wires 113 cross the plurality of second bridge wires 123 and to form a mesh pattern region MPR. In one embodiment, one second bridge wire 123 crosses at least one first input wire 111, or at least one first output wire 112. Besides, in one embodiment of the present disclosure, when viewed in a top view, a plurality of contact structures CT are formed on both sides of the mesh pattern region MPR, and the contact structures CT are arranged along a third direction D3 (i.e. the Y-axis). In some embodiment, the contact structures CT electrically connected to the first wiring pattern 110 and the second wiring pattern 120 along a Z-axis direction. The contact structure CT may be via hole with electrical connecting plug. In some embodiment, the contact structures CT may be disposed at one terminal of the first input wire 111, one terminal of the first output wire 112, one terminal of the second input wire 121, one terminal of the second output wire 122, both terminals of the first bridge wire 113, or both terminals of the second bridge wire 123, but not limited thereto. In another embodiment, the contact structure could be placed in the middle or any place except terminals of the first bridge wire 113 or the second bridge wire Therefore, in this embodiment, as shown in FIGS. 1-3, the plurality of first input wires 111 are electrically connected to the plurality of first output wires 112 through the plurality of second bridge wires 123 and the plurality of contact structures CT respectively; and the plurality of second input wires 121 are electrically connected to the plurality of second output wires 122 through the plurality of first bridge wires 113 and the plurality of contact structures CT respectively. In one embodiment of the disclosure, the first input terminals 114 are interlaced with the second input terminals 124, and the first output terminals 115 are interlaced with the second output terminals 125 with intervals therebetween, but not limited thereto. In another embodiment, the first input terminals 114 may be interlaced with the second input terminals 124 in partially overlapping, and the first output terminals 115 may be interlaced with the second output terminals 125 in partially overlapping, but not limited thereto.

Besides, in this embodiment, the first wiring pattern 110 further comprises a plurality of second intermediate wires 126 extending in a fourth direction D4 (i.e. the X-axis direction, wherein the fourth direction D4 is perpendicular to the third direction D3 in some embodiments) respectively, and the first direction D1 is inbetween the third direction D3 and the fourth direction D4. In another embodiment, the fourth direction D4 may not be perpendicular to the third direction D3. However, in some embodiment of the present disclosure, the second intermediate wires 126 may not be arranged along the fourth direction, and they can be arranged along another direction, the present disclosure is not limited thereto. In addition, the plurality of second intermediate wires 126 can be electrically connected to the plurality contact structures CT. In the present disclosure, the second intermediate wires 126 may electrically connected to other elements, such as thin film transistors (TFT), another electronic devices, signals lines (such as data lines, scan lines), driving IC or other suitable circuits. The present disclosure is not limited thereto. Besides, in one embodiment, the second intermediate wires 126 and the second wiring pattern 120 may disposed in a same layer by a same production process. In another embodiment, the second intermediate wires 126 and the second wiring pattern 120 may disposed in different layers by different production processes.

Since the first wiring pattern 110 is electrically connected to the second wiring pattern 120 through the plurality of contact structures CT, so the signals can be transmitted in the first wiring pattern 110 and in the second wiring pattern 120 alternately. For example, as shown in FIG. 3, signals 1-10 (including signal 1, signal 2, signal 3, signal 4, signal 5, signal 6, signal 7, signal 8, signal 9 and signal 10) are labeled beside the first input terminals 114, beside the second input terminals 124 or beside the second intermediate wires 126. An element labeled with the signal number, representing the signal passing through the element. Takes the signal 1 as an example, the signal 1 is transmitted from a first input terminal 114, passing through a first input wire 111, a second bridge wire 123 and a first output wire 112 in sequence, and reached the first output terminal 115. Besides, the signal 1 also electrically connected to two of the second intermediate wires 126 through the contact structures CT.

The wiring structure of the present disclosure (including the wiring structures 101 and other wiring structures shown in different embodiments of the present disclosure) may have at least one advantage of the following advantages mentioned here: First, the wiring structure can be structured by two conductive layers (i.e. the first wiring pattern 110 and the second wiring pattern 120), so the manufacturing is relatively simple. Second, since the contact structures CT are arranged on both sides of the mesh pattern region MPR along the third direction D3 and do not occupy the area in the mesh pattern region MPR, so the width W of the mesh pattern region MPR is relatively small, and thereby decreasing the total area of the wiring structure and increasing the device density. Third, since each signal path has a similar length, and each wires overlaps the other wires in the top view, the wiring structure may have uniform resistance and uniform coupling capacitance. Fourth, since every wire are overlapped with each other alternatively, the noise and the crosstalk of the wiring structure can be canceled or can be reduced, besides, the EMC (electromagnetic compatibility) effect should be better. Fifth, since there are a plurality of spaces in the mesh pattern region MPR between the wires, so when the following processes, such as an UV curing process for sealing is performed, it does not need to make a greater hole patterns in the mesh pattern region MPR. Or sixth, since the wiring structure has a mesh pattern region MPR, every wire can be made shorter. Therefore, the wiring structure is stronger for against twisting force in case of using flexible substrate compared with conventional straight-line wiring patterns.

It should be note that the sizes, the dimensions or the ranges of each element shown in the embodiment are only for illustrated, and the present disclosure is not limited thereto.

In this present disclosure, the wiring structure can be electrically connected to other components, such as TFT, display medium or other suitable circuits. In one case, the semiconductor layer of TFT could comprise amorphous silicon, polysilicon such as low-temp polysilicon (LTPS) or oxide semiconductor such as indium gallium zinc oxide (IGZO). However, the present disclosure is not limited thereto. In one case, the display medium can be liquid crystals (LC), organic light-emitting diodes (OLED), minimeter-sized light-emitting diodes (mini LED), micrometer-sized light-emitting diodes (micro LED), quantum dot light-emitting diodes (QLED), quantum dots (QD), phosphors, fluorescence or other display elements, and is not limited thereto. A chip size of the LED is about 300 µm to 10 mm, a chip size of the mini-LED is about 100 µm to 300 µm, and a chip size of the micro-LED is about 1 µm to 100 µm, but the present embodiment is not limited thereto.

The following description will detail the different embodiments of the wiring structure of the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
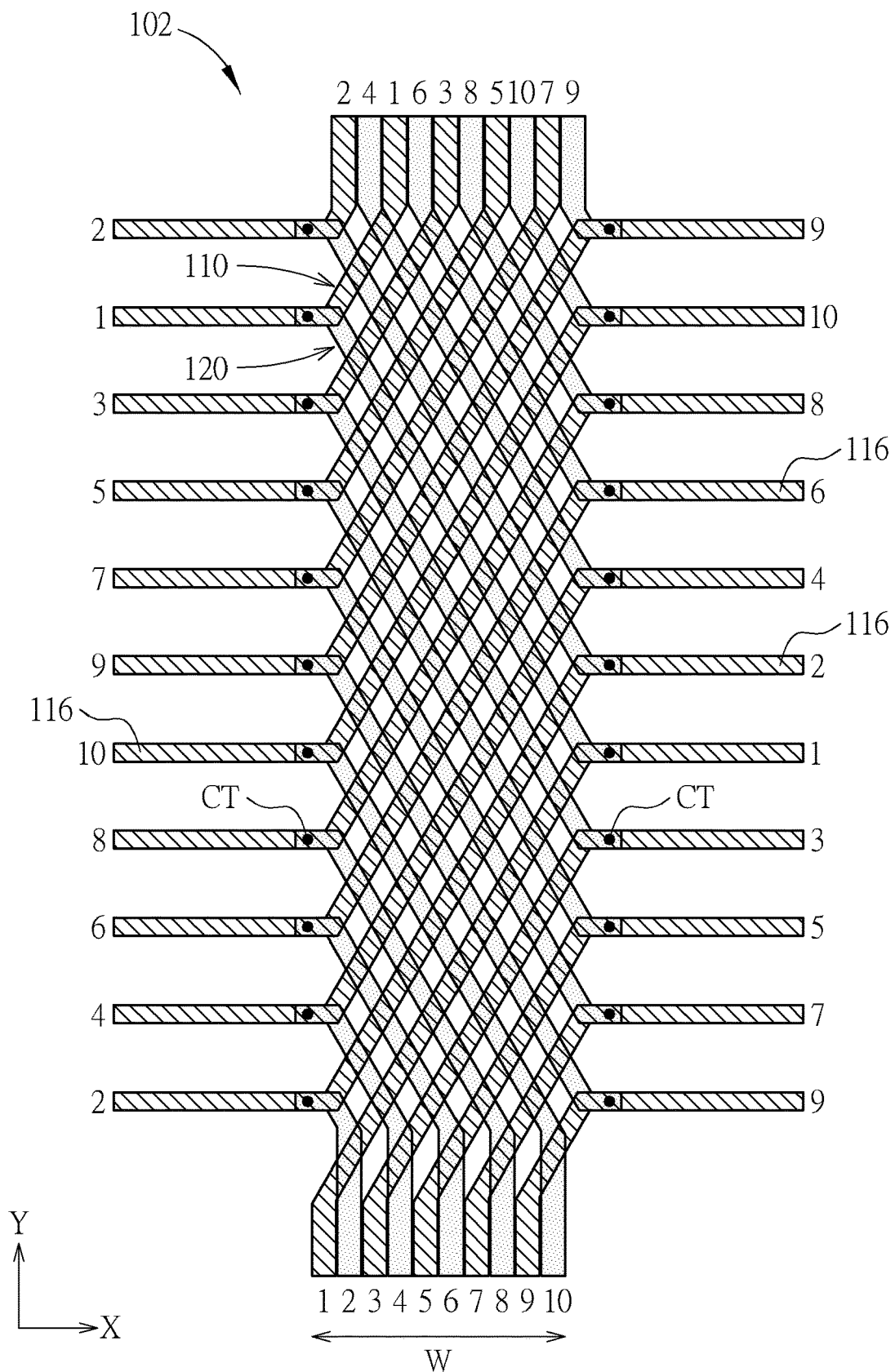
FIG. 4 is a schematic diagram showing a top view of a wiring structure according to a second embodiment of the present disclosure.

Referring to FIG. 4, FIG. 4 is a schematic diagram showing a top view of a wiring structure according to a second embodiment of the present disclosure. In this embodiment, a wiring structure 102 is provided. The difference between the first embodiment and this embodiment is that in this embodiment, the plurality of second intermediate wires 126 are replaced by a plurality of first intermediate wires 116, wherein the first intermediate wires 116 and the first wiring pattern 110 are disposed in a same layer. In other words, the first intermediate wires 116 and the second wiring pattern 120 are disposed in different layers. Besides, in this embodiment, the plurality of first intermediate wires 116 are electrically connected to the first wiring pattern 110 and/or the second wiring pattern 120 through the plurality of contact structures CT, and the first intermediate wires 116 may be arranged along the fourth direction D4 (the X-axis), but not limited thereto.

Figure 5:
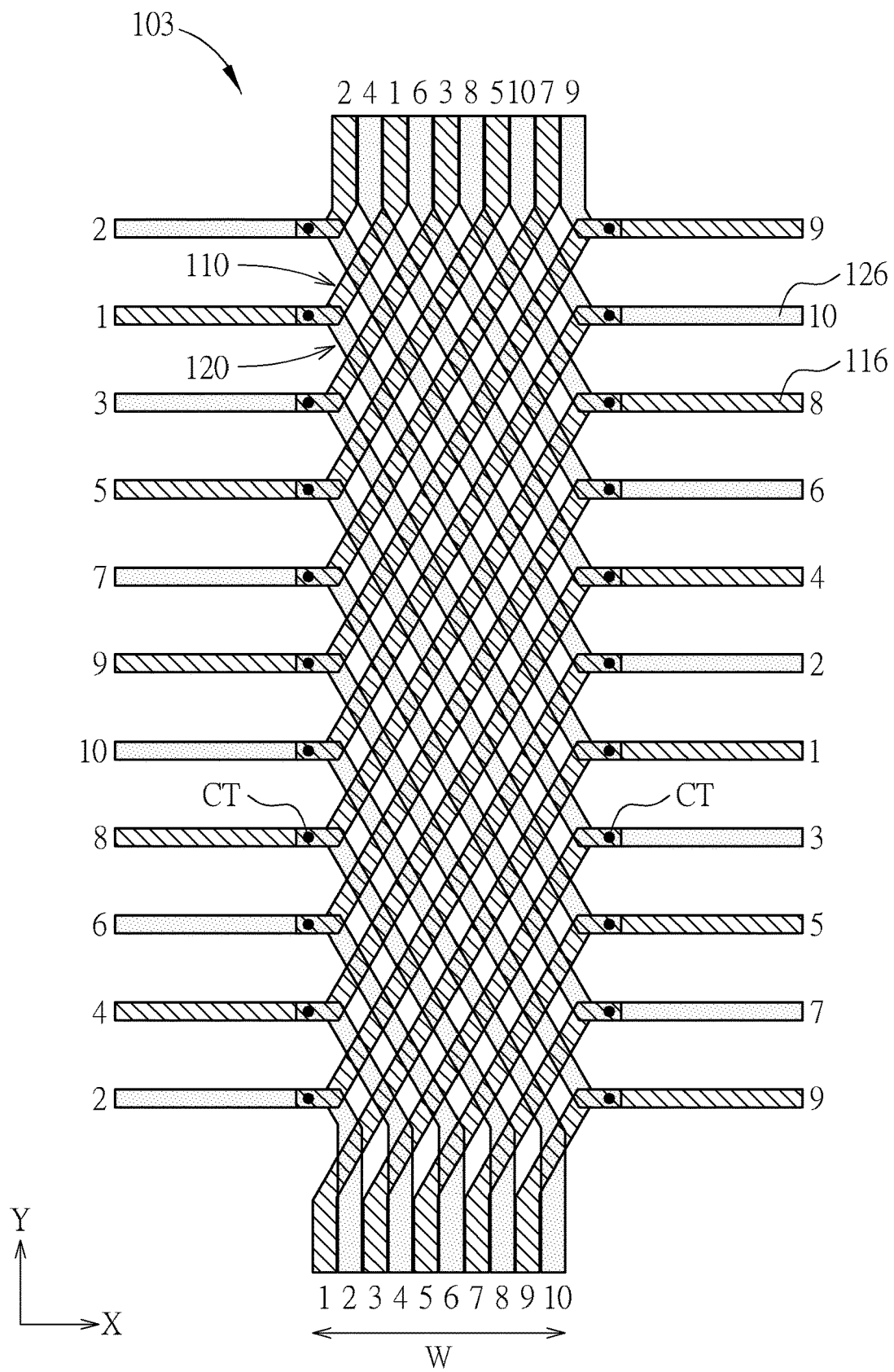
FIG. 5 is a schematic diagram showing a top view of a wiring structure according to a third embodiment of the present disclosure.

Referring to FIG. 5, FIG. 5 is a schematic diagram showing a top view of a wiring structure according to a third embodiment of the present disclosure. In this embodiment, a wiring structure 103 is provided. The difference between the first embodiment and this embodiment is that in this embodiment, the intermediate wires comprise the first intermediate wires 116 and the second intermediate wires 126. In other words, some of the intermediate wires are the first intermediate wires 116 (shown in FIG. 4), and others intermediate wires are the second intermediate wires 126 (shown in FIG. 3). In addition, the first intermediate wires 116 and the second intermediate wires 126 can be arranged alternately. However, the present disclosure is not limited thereto. In some embodiments of the present disclosure, the intermediate wires can be formed in different layers, and the shapes or the positions of the intermediate wires can be adjusted according to actual requirements. Besides, in this embodiment, the plurality of first intermediate wires 116 and the second intermediate wires 126 are electrically connected to the first wiring pattern 110 and/or the second wiring pattern 120 through the plurality of contact structures CT, and the first intermediate wires 116 and/or the second intermediate wires 126 may be arranged along the fourth direction D4 (the X-axis), but not limited thereto.

Figure 6:
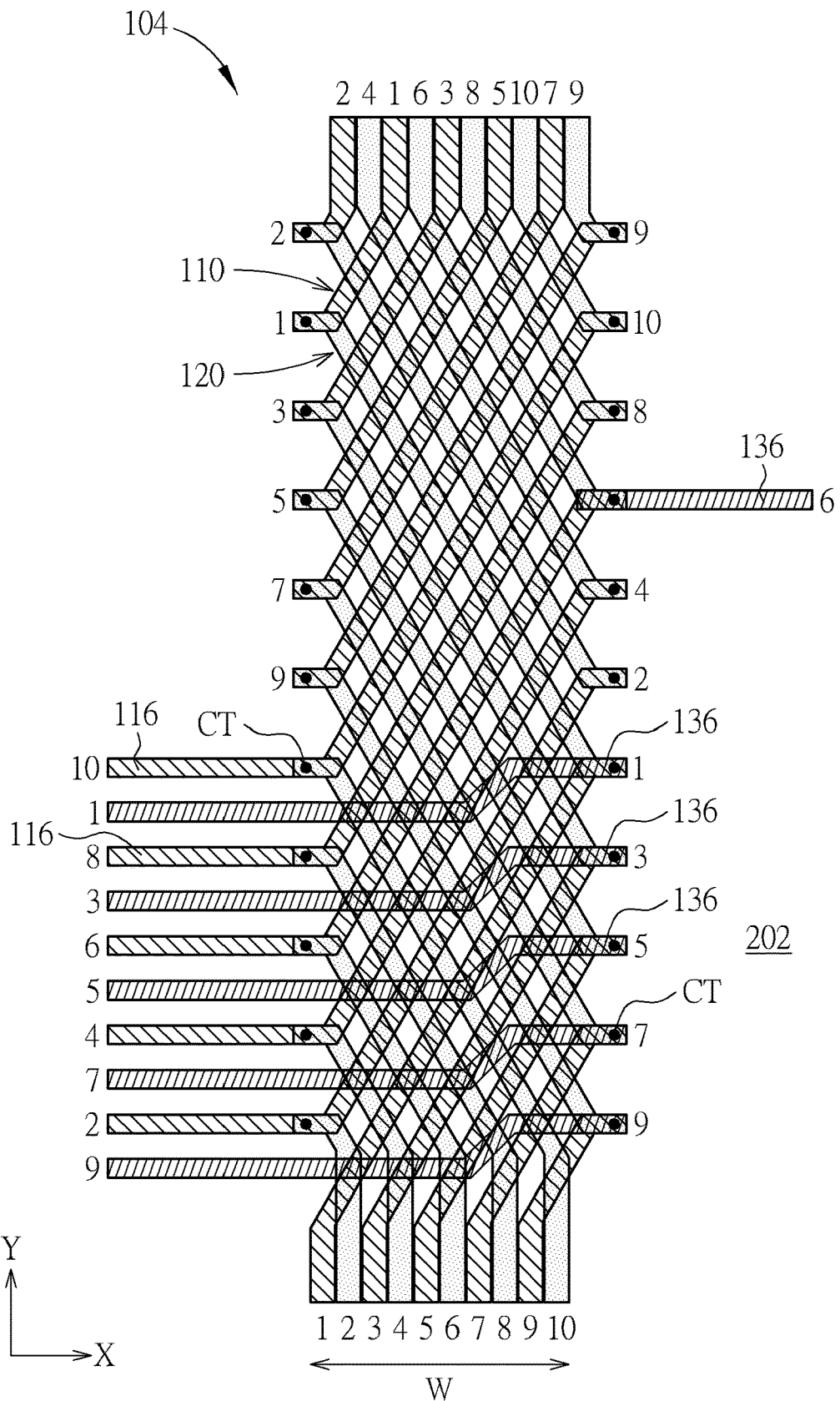
FIG. 6 is a schematic diagram showing a top view of a wiring structure according to a fourth embodiment of the present disclosure.

Referring to FIG. 6, FIG. 6 is a schematic diagram showing a top view of a wiring structure according to a fourth embodiment of the present disclosure. In this embodiment, a wiring structure 104 is provided. The difference between the first embodiment and this embodiment is that in this embodiment, a third wiring pattern can be further formed above the second wiring pattern 120, there is an insulating layer disposed between the third wiring pattern and the second wiring pattern 120. In some embodiment, the second wiring pattern 120 is disposed between the first wiring pattern 110 and the third wiring pattern, and the second wiring pattern 120 is disposed between the two insulating layers. In this embodiment, the third wiring pattern may comprise a plurality of third intermediate wires 136. More detail, the wiring structure 104 of this embodiment further comprises a plurality of third intermediate wires 136 disposed above the second wiring pattern 120, and a second insulating layer 202 is formed between the second wiring pattern 120 and the third intermediate wires 136 (the third wiring pattern). In other words, in this embodiment, the intermediate wires comprise the first intermediate wires 116 and the third intermediate wires 136. In this embodiment, some of the contact structures CT may penetrate the second insulating layer 202 and may be electrically connected to the third intermediate wires 136, therefore, at least one of the third intermediate wires 136 is electrically connected to the first wiring pattern 110 and/or the second wiring pattern 120 through the contact structure CT. In addition, since the third intermediate wires 136 and the second wiring pattern 120 are disposed in different layers, so the shapes or the positions of the third intermediate wires 136 can be adjusted according to actual requirements. In some embodiments, the third intermediate wires 136 may overlap with the second wiring pattern 120.

Figure 7:
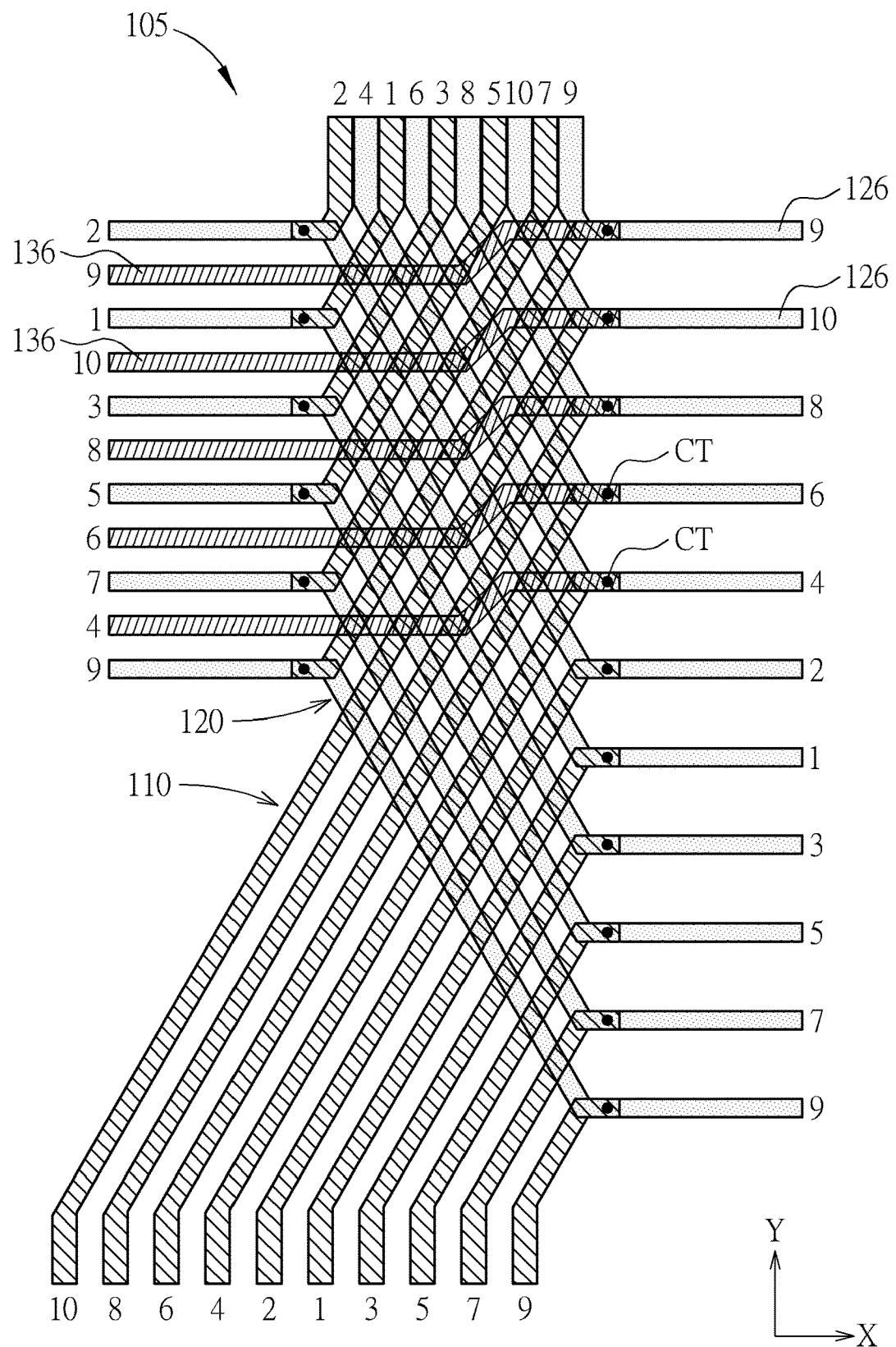
FIG. 7 is a schematic diagram showing a top view of a wiring structure according to a fifth embodiment of the present disclosure.

Referring to FIG. 7, FIG. 7 is a schematic diagram showing a top view of a wiring structure according to a fifth embodiment of the present disclosure. In this embodiment, a wiring structure 105 is provided. In this embodiment, the first bridge wires and the second input wires are omitted, and the number of the first input wires and the first input terminals is adjusted. More detail, the number of the first input wires 111 and the first input terminal 114 in this embodiment is more than the number of the first input wires 111 and the first input terminal 114 recited in other embodiments mentioned above. Specifically, there are ten first input wires 111 and ten first input terminal 114 shown in FIG. 7. Besides, the intermediate wires comprise the plurality of second intermediate wires 126 and the plurality of third intermediate wires 136. Since the second intermediate wires 126 and the plurality of third intermediate wires 136 are disposed on different planes, so in some embodiment of the present disclosure, parts of the third intermediate wires 136 may overlap with the second wiring pattern 120 or the second intermediate wires 126.

Figure 8:
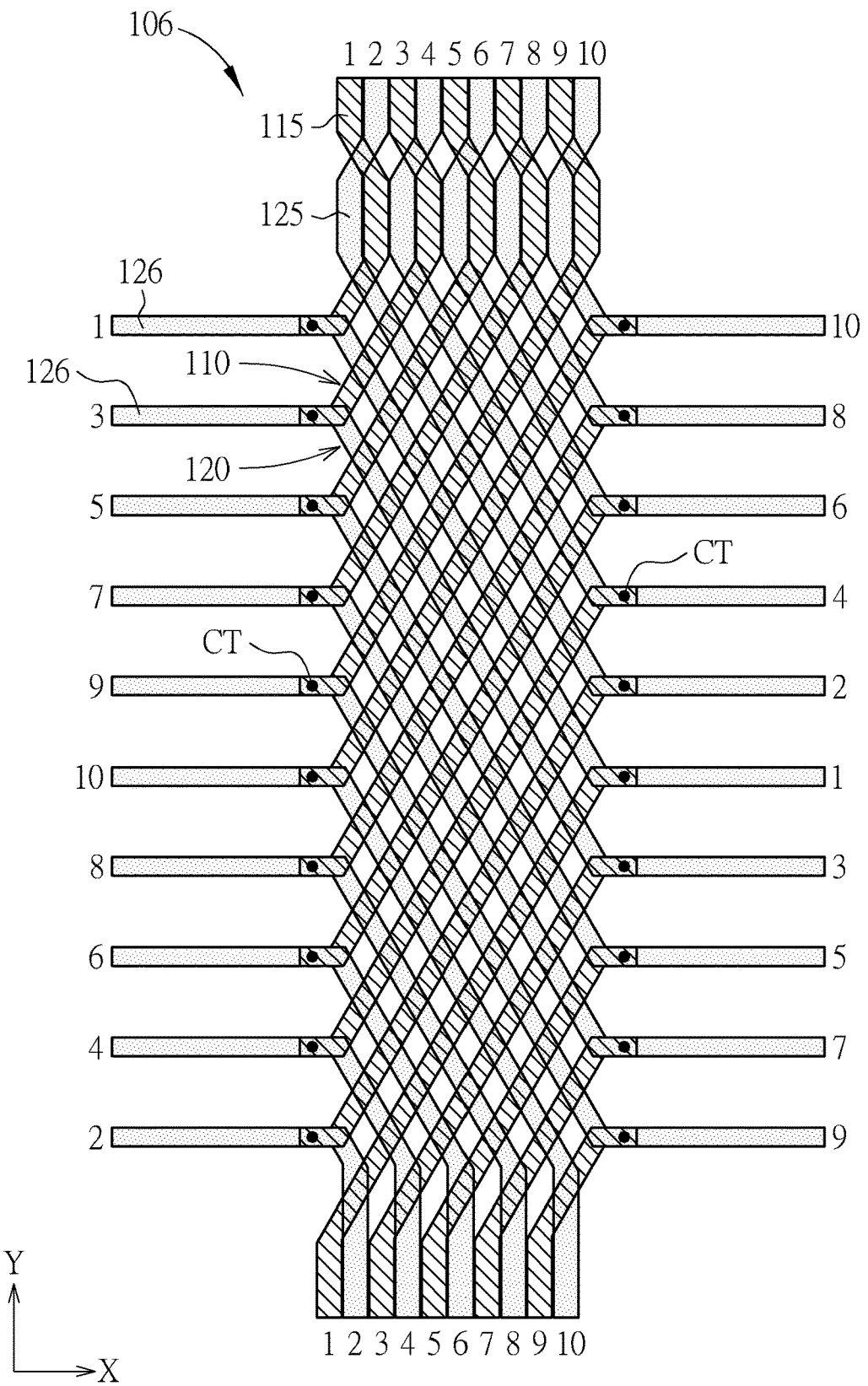
FIG. 8 is a schematic diagram showing a top view of a wiring structure according to a sixth embodiment of the present disclosure.

Referring to FIG. 8, FIG. 8 is a schematic diagram showing a top view of a wiring structure according to a sixth embodiment of the present disclosure. In this embodiment, a wiring structure 106 is provided. It should be note that in this embodiment, the plurality of second output terminals 125 interlace with and cross the plurality of first output terminals 115, or the plurality of first output terminals 115 interlace with and cross the plurality of second output terminals 125. Therefore, the arranging order of the signals at the input terminals can be same as the arranging order of the signals at the output terminals. For example, taking FIG. 8 as an example, from left to right of the input terminals, the signals of numbers 1-10 are sequentially arranged, and at the output terminals, the signals of numbers 1-10 are also arranged in order from left to right. In this embodiment, the wiring structure 106 may be electrically connected to another wiring structure along the Y-axis direction, and the output terminals of the wiring structure 106 may be used as the input terminals of another wiring structure. In other words, a plurality of wiring structures 106 can be connected to each other repeatedly.

Besides, in some embodiment of the present disclosure, the plurality of second input terminals 124 may also cross the plurality of first input terminals 114, or the plurality of first input terminals 114 cross the plurality of second input terminals 124, it should also be within the scope of the present disclosure.

In summary, the present disclosure provides a wiring structure, the wiring structure can be formed by two different wiring patterns, and the two different wiring patterns can be electrically connected to each other through a plurality of contact structures. The two wiring patterns are overlapped with each other and to form the wiring structure with a mesh pattern region. The wiring structure with a mesh pattern region has some advantages, such as having a smaller area or narrower width, thereby increasing the overall device density, or having a stronger structure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising
a wiring structure, comprising:
a first wiring pattern comprising a plurality of first input wires along a first direction and a plurality of first output wires along the first direction;
a second wiring pattern comprising a plurality of second bridge wires along a second direction different from the first direction, one of the plurality of second bridge wires crosses at least one of the plurality of first input wires or at least one of the plurality of first output wires; and
a first insulating layer disposed between the first wiring pattern and the second wiring pattern;
wherein one of the plurality of first input wires is electrically connected to corresponding one of the plurality of first output wires through one of the plurality of second bridge wires.

2. The electronic device of claim 1, wherein the first wiring pattern further comprises a plurality of first bridge wires along the first direction and disposed between the plurality of first input wires and the plurality of first output wires, the second wiring pattern further comprises a plurality of second input wires along the second direction and a plurality of second output wires along the second direction, the plurality of second bridge wires are located between the plurality of second input wires and the plurality of second output wires, and one of the plurality of second input wires is electrically connected to corresponding one of the plurality of second output wires through one of the plurality of first bridge wires.

3. The electronic device of claim 2, wherein one of the plurality of first bridge wires cross at least one of the plurality of second bridge wires.

4. The electronic device of claim 2, wherein first wiring pattern further comprising a plurality of first input terminals along a third direction different from the first direction and the second direction and electrically connected to the plurality of first input wires respectively, and a plurality of second input terminals along the third direction and electrically connected to the plurality of second input wires respectively, wherein the plurality of first input terminals interlace with the plurality of second input terminals.

5. The electronic device of claim 4, wherein one of the plurality of first input terminals crosses adjacent one of the plurality of second input terminals.

6. The electronic device of claim 4, wherein the third direction is inbetween the first direction and the second direction.

7. The electronic device of claim 6, wherein an included angle between the first direction and the third direction is different from and included angle between the second direction and the third direction.

8. The electronic device of claim 6, wherein an included angle between the first direction and the third direction is equal to and included angle between the second direction and the third direction.

9. The electronic device of claim 2, the wiring structure further comprising a plurality of first output terminals electrically along a third direction different from the first direction and the second direction and connected to the plurality of first output wires respectively, and a plurality of second output terminals along the third direction and electrically connected to the plurality of second output wires respectively, wherein the plurality of first output terminals interlace with the plurality of second output terminals.

10. The electronic device of claim 1, wherein the plurality of second bridge wires comprise a plurality of second input ends located in a third direction different from the first direction and the second direction and a plurality of second output ends located in the third direction.

11. The electronic device of claim 10, wherein the plurality of first input wires contact the plurality of second input ends respectively, and the plurality of the first output wires contact the plurality of second output ends respectively.

12. The electronic device of claim 10, wherein the first wiring pattern further comprises a plurality of first intermediate wires extending in a fourth direction respectively, wherein the fourth direction is different from the first direction, the second direction and the third direction, and the plurality of first intermediate wires contact the plurality of second input ends or the plurality of second output ends respectively.

13. The electronic device of claim 12, wherein the first wiring pattern and the plurality of first intermediate wires are in a same layer.

14. The electronic device of claim 12, wherein the first direction is inbetween the third direction and the fourth direction.

15. The electronic device of claim 10, wherein the second wiring pattern further comprises a plurality of second intermediate wires extending in the fourth direction respectively, wherein the fourth direction is different from the first direction, the second direction and the third direction, and the plurality of second intermediate wires contact the plurality of second input ends or the plurality of second output ends.

16. The electronic device of claim 15, wherein the second wiring pattern and the plurality of second intermediate wires are disposed in a same layer.

17. The electronic device of claim 10, further comprising a third wiring pattern and a second insulating layer disposed between the second wiring pattern and the third wiring pattern, wherein the third wiring pattern comprises a plurality of third intermediate wires contact the plurality of second input ends or the plurality of second output ends respectively.

18. The electronic device of claim 17, wherein the second wiring pattern is disposed between the first insulating layer and the second insulating layer.

* * * * *